US007718548B2

(12) United States Patent
Lee et al.

(10) Patent No.: US 7,718,548 B2
(45) Date of Patent: May 18, 2010

(54) SELECTIVE COPPER-SILICON-NITRIDE LAYER FORMATION FOR AN IMPROVED DIELECTRIC FILM/COPPER LINE INTERFACE

(75) Inventors: Sang M. Lee, Cupertino, CA (US); Vladimir Zubkov, Mountain View, CA (US); Zhenijiang Cui, San Jose, CA (US); Meiyee Shek, Palo Alto, CA (US); Li-Qun Xia, Santa Clara, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 70 days.

(21) Appl. No.: 11/950,691

(22) Filed: Dec. 5, 2007

(65) Prior Publication Data

US 2008/0213997 A1    Sep. 4, 2008

Related U.S. Application Data

(60) Provisional application No. 60/868,861, filed on Dec. 6, 2006.

(51) Int. Cl.
*H01L 21/469* (2006.01)
(52) U.S. Cl. .................. 438/775; 438/758; 438/769; 427/532
(58) Field of Classification Search .................. 438/687, 438/714, 758; 257/E21.081, E23.161, E39.01
See application file for complete search history.

(56) References Cited

U.S. PATENT DOCUMENTS 6,054,379 A    4/2000 Yau et al.
6,072,227 A    6/2000 Yau et al.
6,319,842 B1 *  11/2001 Khosla et al. ............... 438/714
6,818,557 B1 *  11/2004 Ngo et al. .................... 438/687
2004/0235292 A1 *  11/2004 Rajagopalan et al. ....... 438/637

OTHER PUBLICATIONS

"Integration and Characterization of a Self-aligned Barrier to Cu Diffusion Based on Copper Silicide", Proc. of Advanced Metallization Conference, MRS, pp. 321-327, Oct. 21-23, 2003.*
"Effect of Plasma Treatments on Ultra Low-k Material Properties", J. of Microelectronic Engineering, vol. 82, pp. 399-404, Aug. 2005.*

(Continued)

*Primary Examiner*—Charles D Garber
*Assistant Examiner*—Yasser A Abdelaziez
(74) *Attorney, Agent, or Firm*—Townsend and Townsend and Crew

(57) ABSTRACT

A process to form a copper-silicon-nitride layer on a copper surface on a semiconductor wafer is described. The process may include the step of exposing the wafer to a first plasma made from helium. The process may also include exposing the wafer to a second plasma made from a reducing gas, where the second plasma removes copper oxide from the copper surface, and exposing the wafer to silane, where the silane reacts with the copper surface to selectively form copper silicide. The process may further include exposing the wafer to a third plasma made from ammonia and molecular nitrogen to form the copper silicon nitride layer.

16 Claims, 10 Drawing Sheets

OTHER PUBLICATIONS

Plantier et al. ("Material and Electrical Characterization of TMS-based Silicidation of the Cu-dielectric Barrier Interface for Electromigration Improvement of 65 nm Interconnect"), Microelectronic Engineering, vol. 83, pp. 2407-2411, 2006.*

Chhun et al. ("Impact of Introducing CuSiN Self-aligned Barriers in Advanced Copper Interconnect"), Microelectronic Engineering, vol. 82, pp. 587-593, 2005.*

* cited by examiner

SELECTIVE COPPER-SILICON-NITRIDE LAYER FORMATION FOR AN IMPROVED DIELECTRIC FILM/COPPER LINE INTERFACE

CROSS-REFERENCES TO RELATED APPLICATIONS

This application claims the benefit of U.S. Provisional Application No. 60/868,861, filed Dec. 6, 2006. The entire contents of the provisional application is herein incorporated by reference for all purposes.

BACKGROUND OF THE INVENTION

Integrated circuits (IC) are manufactured by forming discrete semiconductor devices on a surface of a semiconductor substrate, such as a silicon (Si) wafer. A multi-level network of interconnect structures is then formed to interconnect the devices. Copper (Cu) is the wiring material of choice for interconnect structures of advanced IC devices having a high circuit density. In addition to superior electrical conductivity, copper is more resistant than aluminum (Al) to electromigration, a phenomenon that may destroy a thin film conductive line during IC operation.

In the semiconductor industry, much effort is spent in developing smaller IC devices with ever-increasing operating speeds. To increase the circuit density, a dual damascene technique may be used during fabrication of the IC devices. Then, to increase the operating speed of such a device, intermetal dielectric (IMD) layers are formed using materials having dielectric constants less than 4.0. Such materials are generally referred to as low-k materials. The low-k materials generally comprise carbon-doped dielectrics, such as organic doped silicon glass (OSG), fluorine doped silicon glass (FSG), organic polymers, and the like.

An IC device comprises a plurality of interconnect structures that are separated from each other and the substrate by the IMD layers. Such structures are generally fabricated using a dual damascene technique that comprises forming an insulator layer (e.g., IMD layer) into which trenches and openings are etched to pattern the contact vias and the conductive lines. The copper is then used to fill (metallize) the trenches and openings in the IMD layer, forming vias and conductive lines, respectively. During the copper metallization process, an excess amount of copper may be deposited onto the substrate. The excess metal may be removed using a planarization process, e.g., chemical-mechanical polishing (CMP) process. After the planarization process, the next wiring layer may be formed on top of the IMD layer.

One problem with the use of copper in the interconnect structures is its tendency to diffuse into silicon dioxide, silicon and other adjacent dielectric materials. Therefore, barrier layers become increasingly important to prevent copper from diffusing into the dielectric and compromising the integrity of the device. Barrier layers for copper applications are available for inter-dielectric applications. However, many of these barrier layers need an adhesion layer between the copper surface and the barrier layer to prevent the barrier layer from separating. Poor adhesion of the copper to a diffusion barrier results in portions of the copper being undesirably peeled away during polishing. This condition can also render an integrated circuit defective.

When these adhesion layers are formed on the copper surface they can increase the sheet resistance (Rs) of the copper interconnect. Accordingly, there is a need to employ a process of improving the adhesion of CVD copper to a diffusion barrier material surface without significantly increasing the sheet resistance of the underlying copper interconnect. These and other problems are address by the present invention.

BRIEF SUMMARY OF THE INVENTION

Processes are described for forming a $CuSi_xN_y$ adhesion layer on a copper surface with minimal change in the copper's sheet resistance (Rs) and zero or negative changes in the dielectric constant of surrounding dielectric materials. The formation of $CuSi_xN_y$ layer begins with a He plasma pretreatment, which protects nearby carbon-doped dielectric material (e.g., Black Diamond™ from Applied Materials, Inc.) from the $CuSi_xN_y$ formation process. This He pre-treatment can maintain or even reduce the dielectric constant ($\kappa$) of the dielectric material. Following the helium pre-treatment, a diluted $NH_3$ (d-NH3) plasma treatment that cleans the native CuO from the copper surface may be performed. After the $NH_3$ plasma pretreatment, a copper silicide ($CuSi_x$) layer may be formed by thermally reacting silane ($SiH_4$) with copper (i.e., a "silane soak"). Because $CuSi_x$ is formed thermally, it selectively forms on the copper. Once $CuSi_x$ is formed, an $NH_3/N_2$ plasma treatment may be applied to nitridize $CuSi_x$ into the $CuSi_xN_y$ adhesion layer. This layer permits a subsequently deposited copper diffusion barrier layer to have improved adherence to the underlying copper interconnect.

In embodiment of the process the deposited barrier layer may be a silicon carbide layer such as a BLOk™ from Applied Materials. BLOk™ (Barrier LOw-k) films are a silicon carbide films formed using the chemical vapor deposition (CVD) or plasma enhanced CVD process described in commonly owned U.S. Pat. No. 6,287,990 B1, issued Sep. 11, 2001, and U.S. Pat. No. 6,303,523 B2, issued Oct. 16, 2001, which are incorporated herein by reference. The BLOk™ films include BLOk™ I and BLOk™ II, which is an improved version of BLOk™ I, both of which are available from Applied Materials of Santa Clara, Calif.

Embodiments of the invention include a process to form a copper-silicon-nitride layer on a copper surface on a semiconductor wafer. The process may include the step of exposing the wafer to a first plasma made from helium. The process may also include exposing the wafer to a second plasma made from a reducing gas, where the second plasma removes copper oxide from the copper surface, and exposing the wafer to silane, where the silane reacts with the copper surface to selectively form copper silicide. The process may further include exposing the wafer to a third plasma made from ammonia and molecular nitrogen to form the copper silicon nitride layer.

Embodiments of the invention may also include a process of forming a dielectric barrier for a copper interconnect. The process may include forming a gap in a carbon-doped silica dielectric material and forming at least part of the copper interconnect in the gap. The process may also include exposing a surface of the copper interconnect to a first plasma made from helium, and exposing the copper surface to a second plasma made from a reducing gas, where the second plasma removes copper oxide from the copper surface. The method may still further include exposing the copper surface to silane, where the silane reacts with the copper surface to selectively form copper silicide, and exposing the copper silicide to a third plasma made from ammonia and molecular nitrogen to form the copper silicon nitride layer. The barrier layer may be deposited on the copper silicon nitride layer.

Embodiments of the invention further include a process of forming a selective copper silicon nitride layer on a copper surface in contact with a carbon-doped silica dielectric material on a wafer substrate. The process may include pretreating the copper surface with a plasma made from helium, and forming the copper silicon nitride layer on the pretreated copper surface. The dielectric constant of the carbon-doped silica is a same or lower value than before the pretreatment with the plasma.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

With the advent of copper dual damascene, dielectric copper barriers are becoming the cornerstone for back end of line device reliability. The interface between copper and dielectric barrier is often the fastest diffusion path for the EM of copper, and that the improved adhesion of barrier film to copper increases the lifetime of EM. The present invention includes processes for engineering an interface between copper and a barrier layer to improve the EM performance. These processes can improve EM performance up to an order of magnitude or more compared to conventional barrier layer deposition by forming a thin (~100 Å or less) $CuSi_xN_y$ adhesion layer between the copper film and barrier layer.

The present processes for forming the $CuSi_xN_y$ barrier layer can achieve the following results: (1) a small change in the dielectric constant ($\kappa$) of the nearby dielectric material; (2) a small increase in the sheet resistance (Rs) of the copper film; (3) a long EM lifetime; and (4) a component of a good barrier to copper diffusion. The $CuSi_xN_y$ film may also enhance the diffusion barrier property of the interface by reducing the diffusion length of copper into the surrounding low-k dielectric materials. The formation of $CuSi_xN_y$ is selective since it is formed on exposed surfaces of the copper film.

Figure 1A:
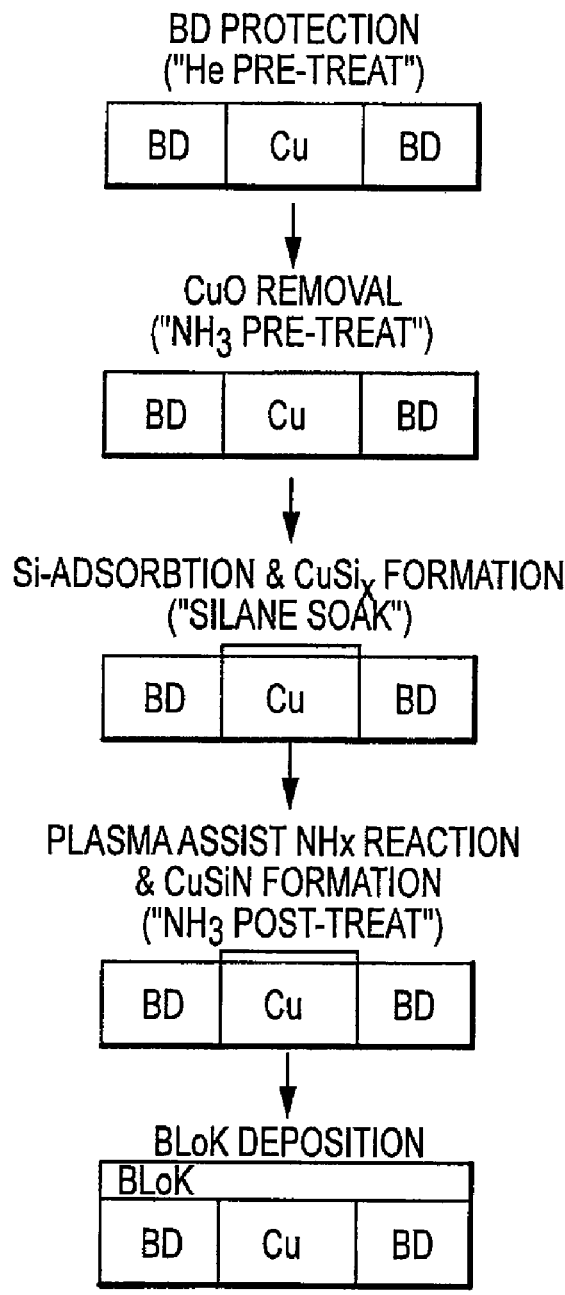
FIG. 1A shows a process flow for forming a $CuSi_xN_y$ layer on an underlying copper interconnect according to embodiments of the invention.

FIG. 1A shows a process flow is shown for forming a $CuSi_xN_y$ layer on an underlying copper interconnect according to embodiments of the invention. This embodiment may include examples of a $CuSi_xN_y$ film formed on Cu using a four step process in a 300 mm PECVD Producer Low-k chamber. The formation of $CuSi_xN_y$ film begins with a He plasma pretreatment to protect surrounding dielectric film from the $CuSi_xN_y$ formation process ("He pre-treat"). Then the process includes exposing the copper film to a reducing gas plasma such as a diluted $NH_3$ (d-$NH_3$) plasma or hydrogen ($H_2$) gas plasma, which cleans the native CuO from the copper surface ("$NH_3$ pre-treat"). After the $NH_3$ plasma pretreatment, a copper silicide ($CuSi_x$) layer is formed by thermally reacting silane ($SiH_4$) with copper (i.e., a "silane soak"). The copper silicide process is a thermal process that selectively forms the $CuSi_x$ on the copper surface. Once $CuSi_x$ is formed, a $NH_3/N_2$ plasma treatment is applied to nitridize $CuSi_x$ into $CuSi_xN_y$ ("$NH_3$ post-treat"). The BLOk barrier layer is then deposited on top of the $CuSi_xN_y$ adhesion layer.

The copper interconnect may be formed by depositing TEOS oxide onto bare silicon substrates, PVD metal barrier and copper seed deposition onto the oxide, electrochemically plating (ECP) copper onto the barrier/seed, and finally chemical mechanical polishing (CMP) the ECP copper.

The dielectric material surrounding the copper layer may be a carbon-doped dielectric such as Black Diamond™ (BD) from Applied Materials, Inc. of Santa Clara, Calif. BD is a low-k dielectric is carbon-doped silica, which is referred to as oxidized organo-silane because of its typical formation process. Yau et al. have described a method of forming such an oxidized carbon-silicon material in U.S. patent application Ser. No. 09/021,788, filed Feb. 11, 1998, and Ser. No. 09/114,682, filed Jul. 13, 1998, both incorporated by reference in their entireties. They use a chemical vapor deposition (CVD) process with gaseous precursors of an organo-silane and an oxidizer to form a low-k dielectric having a dielectric constant in the range of 2.5 to 3. The CVD process is carried out in a low-power capacitively coupled plasma having a power density on the wafer of less than 1 W/cm² and at a temperature of less than 100° C. Its bulk hardness is approximately one third that of thermal oxide. Embodiments of the material include porous, oxidized organo-silane films having between 1 and 50% atomic doping with carbon, preferably around 20%.

Figure 1B:
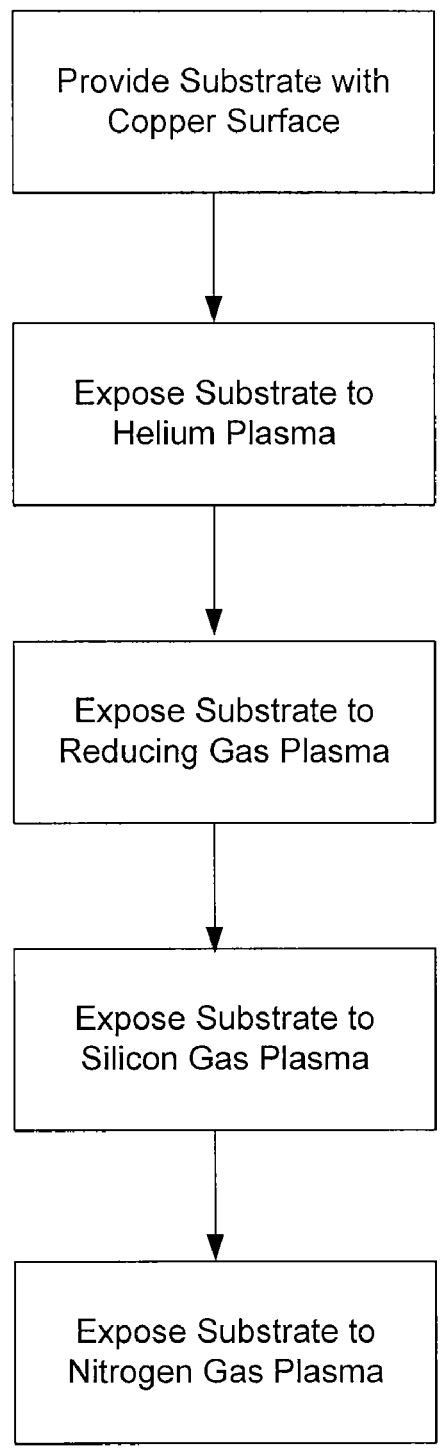
FIG. 1B is a flowchart of steps in a process of making a $CuSi_xN_y$ layer according to embodiments of the invention.

Referring now to FIG. 1B, a flowchart is shown with steps in a process of making a $CuSi_xN_y$ layer according to additional embodiments of the invention. The process starts with providing a substrate with a copper surface. The substrate may be a semiconductor wafer (e.g., a 300 mm wafer of Si, Ge, GeAs, etc.). The copper surface may be a surface of a copper wire line (e.g., a copper interconnect) that is surrounded by dielectric material. As noted above, the dielectric material may undoped silicon oxide, or carbon-doped silicon oxide (e.g., Black Diamond™), among other dielectric materials.

The substrate is exposed to a plasma derived from helium (the He pretreatment step). The plasma may consist essentially of helium such that any other precursors are present in amounts too small to cause a significant change to the copper surface or the surrounding dielectric material. In additional embodiments, the helium may be mixed with other inert gases, such as neon, argon, krypton, xenon, molecular nitrogen ($N_2$), etc.

After the helium pretreatment step, the substrate may be exposed to a plasma made from a reducing gas to reduce copper oxide (CuO) on the copper surface. The reducing gas may be a hydrogen containing gas such as ammonia ($NH_3$) or molecular hydrogen ($H_2$), as well as mixtures of both types of gas. In addition, the reducing gas may include an inert gas (e.g., He, $N_2$, etc.) that dilutes the concentration of the hydrogen containing gas in the reducing gas. The plasma exposure time may be long enough to remove substantially all of the CuO from the copper surface prior to subsequent steps for forming the $CuSi_xN_y$ layer.

The substrate may then be exposed to a plasma made from a silicon containing gas such as silane ($SiH_4$). The silane reacts with the exposed copper surface to form a copper silicide ($CuSi_x$) layer on the surface of the copper interconnect. The reaction between the silicon and copper to form the silicide layer may be a thermally driven process that does not involve the use of a plasma to encourage the reaction. Because the silane reacts selectively with copper, the copper silicide layer is found only in regions of the substrate where the copper surface has been exposed to the silane.

The copper silicide layer is then exposed to a plasma made from a reactive nitrogen containing precursor, such as ammonia. Embodiments of the precursor may also include mixtures of ammonia and molecular nitrogen (i.e., $NH_3/N_2$ mixtures). The reactive nitrogen species react with the copper silicide to form the copper silicon nitride ($CuSi_xN_y$) layer.

Figure 1C:
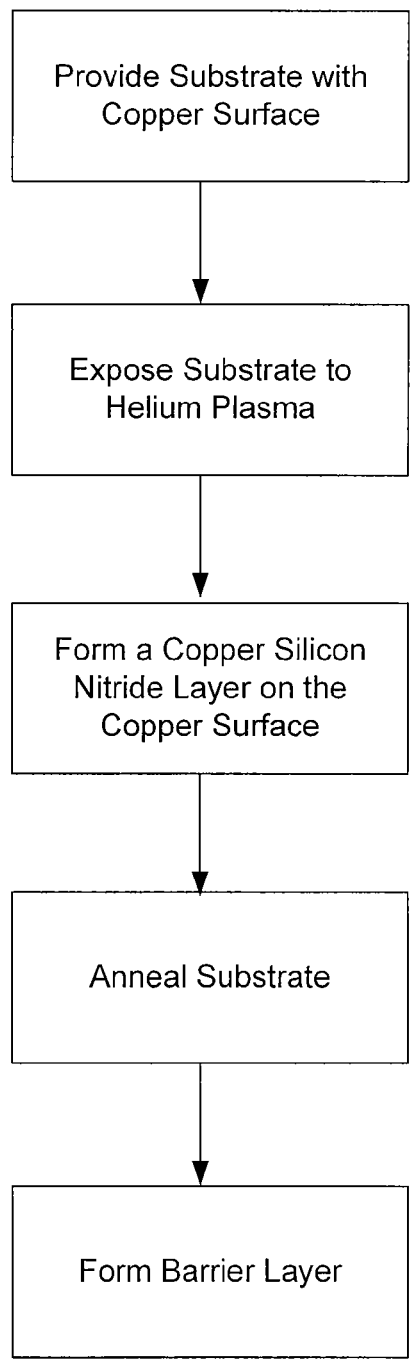
FIG. 1C is a flowchart of steps in a process of forming a copper silicon nitride adhesion layer on a barrier layer according to embodiments of the invention.

FIG. 1C is a flowchart with steps in another process of forming a copper silicon nitride adhesion layer on a barrier layer according to embodiments of the invention. The process includes providing a substrate that has a copper surface (e.g., a copper interconnect) on which the $CuSi_xN_y$ layer is formed. The substrate is first exposed to a plasma that is made from a plasma gas comprising, consisting essentially of, or consisting exclusively of helium. The helium pretreatment step can reduce (and sometimes even reverse) the increase in κ-value of the dielectric material (e.g., carbon-doped silicon oxides such as Black Diamond™) that result from the $CuSi_xN_y$ layer formation process.

Following the He pretreatment, a copper silicon nitride layer is formed on the copper surface. The formation of the $CuSi_xN_y$ layer may include exposing the copper surface to a second plasma made from a reducing gas (e.g., a gas that includes ammonia and/or molecular hydrogen). This reducing gas plasma removes copper oxide from the copper surface. The copper surface may then be exposed to a thermal treatment in a silane ($SiH_4$) containing atmosphere. At 350° C., the silane selectively reacts with the copper surface to form copper silicide ($CuSi_x$). The silicided copper surface may then be exposed to a third plasma made from a nitrogen containing gas (e.g., a gas that include ammonia and molecular nitrogen) to form the $CuSi_xN_y$ layer. The $CuSi_xN_y$ layer may have a thickness of, for example, about 40 Å to about 100 Å.

The substrate that now includes the selectively formed $CuSi_xN_y$ layer may then be annealed. The anneal temperature may be about 400° C. or more for a period of about 10 minutes or more. In one example, the anneal is performed at about 450° C. for about 30 minutes.

The process also includes forming a barrier layer on the annealed $CuSi_xN_y$ layer. The barrier layer is a layer that slows the electromigration (EM) of copper from the $CuSi_xN_y$ and copper metal. Examples of the barrier layer include silicon and carbon containing materials such as BLOk™ and BLOkII™ from Applied Materials. The $CuSi_xN_y$ layer can act as an adhesion layer to keep the barrier layer from separating from the underlying copper interconnect.

EXPERIMENTAL

Experiments were conducted to measure the efficacy of the helium pretreatment step in protect the dielectric material surrounding the copper interconnect during the $CuSi_xN_y$ formation process. These experiments included measurements of the dielectric constant (κ) of the dielectric materials surrounding the copper at various stages in $CuSi_xN_y$ formation processes. Comparative κ-value measurements were taken for dielectric materials that did and did not undergo a helium pretreatment process, and CuO reduction process.

The sheet resistance and reflectivity of the copper were also measured to estimate the degree to which copper silicide was formed, since the resistivity of Cu (about $1.72 \times 10^{-8}$ Ωm) is about 3-4 orders of magnitude less than that of copper silicide (about $5.3 \times 10^{-5}$ Ωm). For the measurement, $CuSi_xN_y$ was formed on blanket copper wafer and 50 Å BKM BLOk film was deposited on top of it as a protection layer. After sheet resistance and reflectivity measurements, samples were annealed at 450° C. for 30 min., and the same measurements were performed again. As more copper silicide formed with annealing, the sheet resistance was further increased due to the higher resistance of $CuSi_x$. The formation of $CuSi_xN_y$ needs to be engineered to minimize the Rs increase, since the increased Rs of Cu degrades device performance.

The thickness of $CuSi_xN_y$ was characterized using TEM. In a comparative example, 1000 Å SiOCH layer was deposited on top of the $CuSi_xN_y$ layer and the sample was annealed at 450° C. for 30 minutes to investigate the copper barrier performance of $CuSi_xN_y$. After annealing, SIMS depth profiling was used to determine the diffusion depth of Cu into SiOCH layer.

A quantum mechanical (QM) simulation was also run to simulate the interaction of a Cu lattice system with $SiH_4$, $NH_3$, and $H_2$ at various steps of $CuSi_xN_y$ formation processes. The simulations also produced estimates of the diffusion copper atoms into the surrounding dielectric material and barrier layer.

Figure 2:
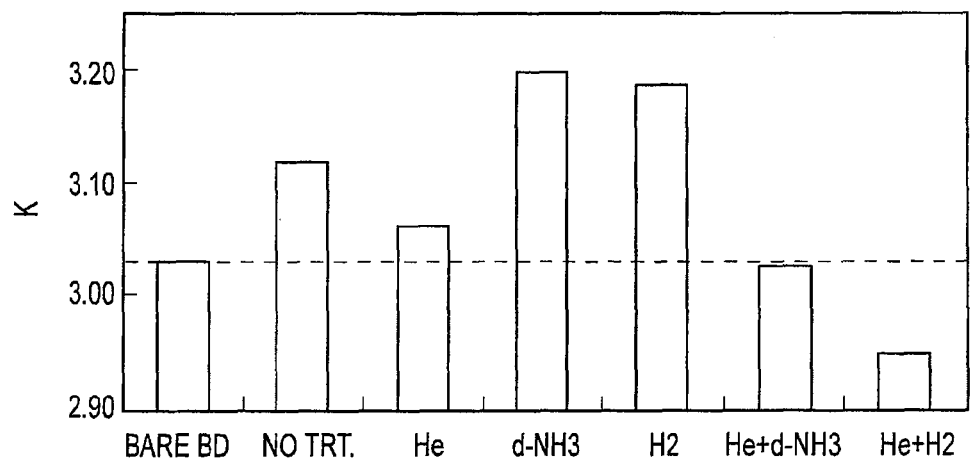
FIG. 2 shows a bar chart of the value of the dielectric constant ($\kappa$) at various stages of forming a $CuSi_xN_y$ layer on an underlying copper interconnect.

The effect of $CuSi_xN_y$ formation on the dielectric constant values (κ-values) of the surrounding Black Diamond ("BD") dielectric material (which measured about 2000 Å thick) is presented in FIG. 2. With no helium pretreatment step, a $CuSi_xN_y$ process increases κ of BD by about 0.1, while a $CuSi_xN_y$ process that includes a CuO reduction step using either ammonia or hydrogen as the reduction gas increases κ by about 0.16. Most surprisingly, the combination of a helium pretreatment step with a CuO reduction step showed the κ-value increase can be prevented and even reversed to a zero or negative κ-value change.

Figure 3A:
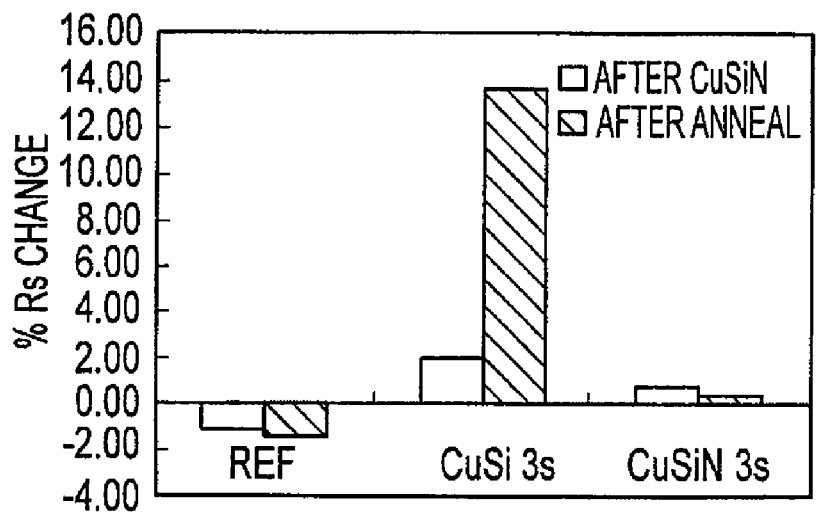
FIG. 3A is a bar chart plotting percent changes in the sheet resistance (Rs) of a copper layer at various points in a copper silicon nitride formation process.
Figure 3B:
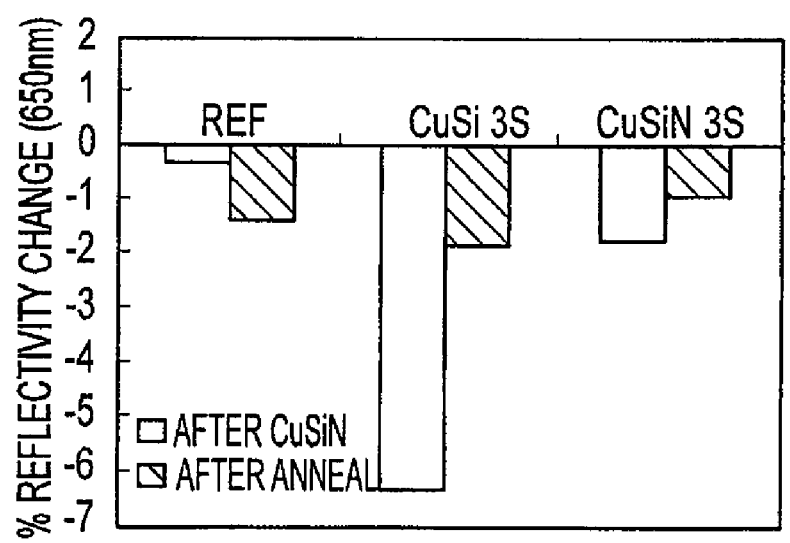
FIG. 3B is a bar chart plotting percent changes in the reflectivity of a copper layer at various points in a copper silicon nitride formation process.

FIGS. 3A&B show Rs and reflectivity changes, respectively, at various stages of the $CuSi_xN_y$ formation process. The reference sample in the figures was pretreated only with a dilute ammonia plasma ($d-NH_3$ plasma) to remove the native copper oxide from the copper surface. As FIGS. 3A&B show, exposure to this reducing plasma resulted in small changes of Rs and reflectivity. As for $CuSi_x$ sample, which was processed by $NH_3$ pre-treat and 3s $SiH_4$ soak, the Rs increased by 2% while its reflectivity decreased by 6%. However, the Rs increased significantly to 14% along with annealing while the reflectivity recovered back close to the value from the reference sample. The increase in Rs and reflectivity recovery after annealing suggest that the Si at the copper surface diffuses further into the copper with annealing to cause the Rs to increase and the reflectivity to recover. On the other hand, both Rs and reflectivity change of $CuSi_xN_y$ are relatively small with annealing, which indicates that $CuSi_x$ has become stabilized by the introduction of nitridation step using NH3 plasma.

Figure 4A:
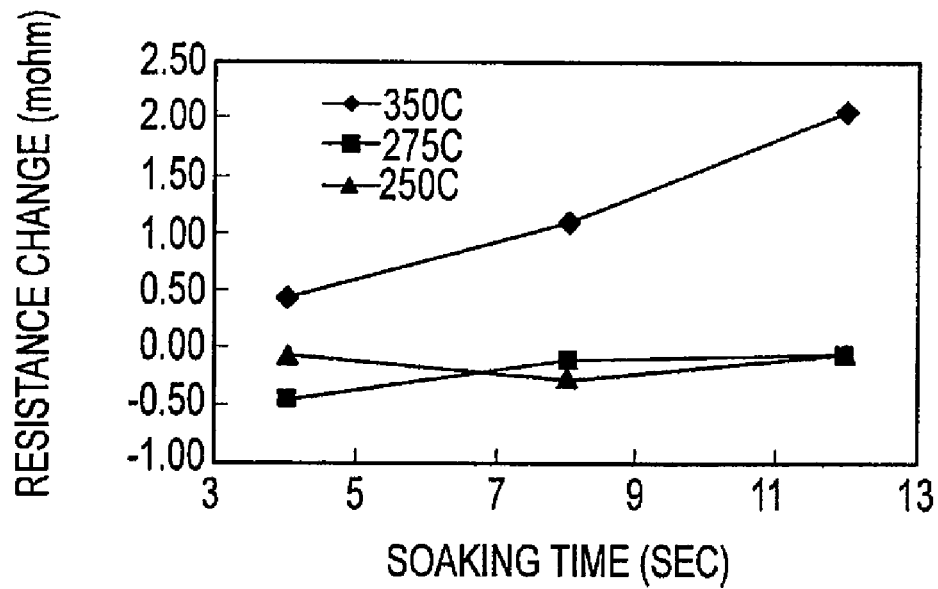
FIG. 4A is a line graph of sheet resistance change in a copper layer as a function of silane soak times for three different soak temperatures.

The change of Rs by $CuSi_xN_y$ formation process was tested as a function of process temperature and $SiH_4$ soaking time for both $He+d-NH_3$ and $He+H_2$ pretreatments (see FIGS. 4A&B). As for the soaking time (FIG. 4A), the Rs change doesn't respond to soaking time for $CuSi_xN_y$ formation process at both 250° C. and 275° C., which implies that the silicidation of Cu at these temperatures is not active. On the other hand, the Rs change at the process temperature of 350° C. is proportional to soaking time, meaning $CuSi_xN_y$ formation is a diffusion driven process whose rate is mainly determined by temperature and density difference of diffusing species at the interface.

Figure 4B:
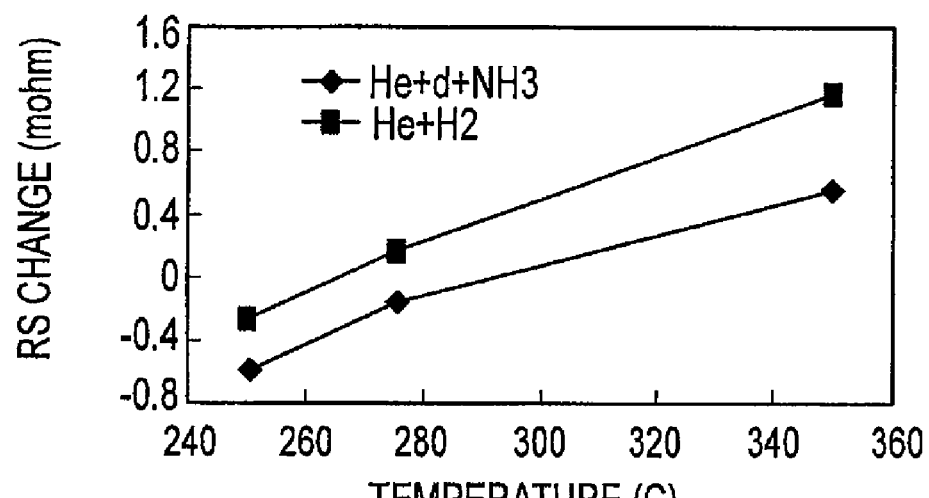
FIG. 4B is a line graph of sheet resistance change in a copper layer as a function of temperature for ammonia and hydrogen gas reduction steps.

FIG. 4B shows the temperature dependence of Rs change for different CuO removal pretreatments—$d-NH_3$ and $H_2$. For the temperature region studied, $CuSi_xN_y$ formation process combined with $He+H_2$ pretreatments gives higher Rs change than the process combined with $He+d-NH_3$ pretreatment. This observation can be interpreted that the diffusion of Si from $SiH_4$ into Cu is less active when $d-NH_3$ pretreatment is combined with $CuSi_xN_y$ formation process. QM simulation gives a good explanation on this observation which will be covered below.

Figure 5:
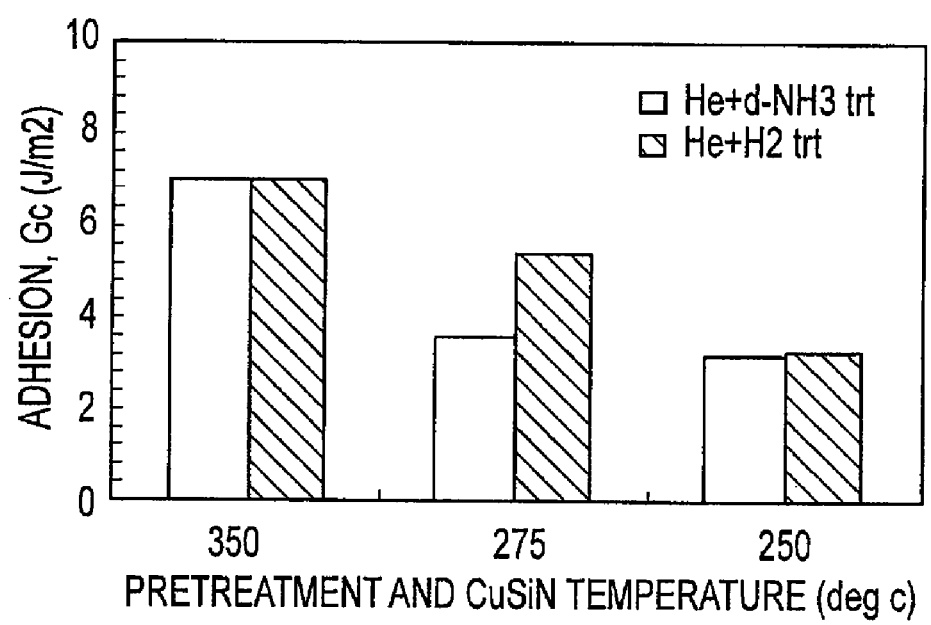
FIG. 5 is a bar chart of adhesion strength at the Cu/CuSiN interface for ammonia and hydrogen gas reduction steps at three different temperatures.

The measurement of adhesion strength is a good way to estimate the EM property since there is a linear relationship between the EM activation energy and the intrinsic work of adhesion. FIG. 5 presents the temperature dependence of the adhesion strength for a film stack of copper, $CuSi_xN_y$, BLOk, and BD. The film stack, whose $CuSi_xN_y$ was processed at 350° C., demonstrates higher adhesion strength than the lower temperature processes. It is believed that the enhanced diffusion of Si into the bulk copper at higher temperature improves the adhesion by forming a thicker transition layer at the interface. Another benefit of $CuSi_xN_y$ formation process at 350° C. is that several steps, such as the He pretreatment, reducing gas pretreatment, $CuSi_xN_y$ formation, and/or BLOk deposition, may be done in-situ in the same chamber, such as the Producer platform used in these experiments.

Even though higher adhesion strength is desired for the EM property improvement, it is also typically accompanied by higher an increased sheet resistance. Therefore detailed process tuning is required to optimize the $CuSi_xN_y$ formation process.

Figure 6A:
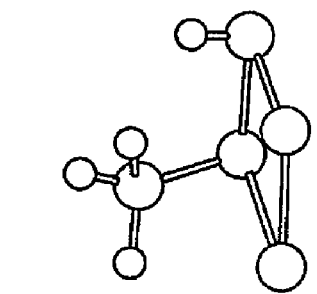
FIGS. 6A&B are pictorial representations of quantum mechanical simulations of silane reaction with a copper metal layer.
Figure 6A:
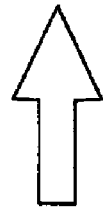
Figure 6A:
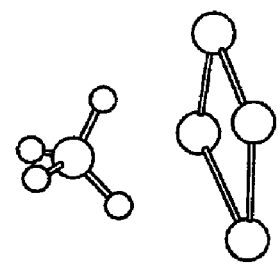
Figure 6B:
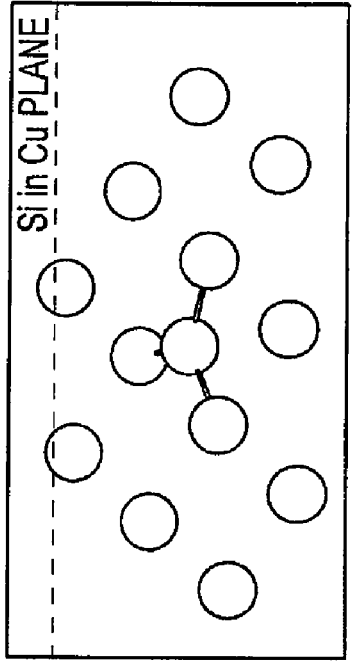
Figure 6B:
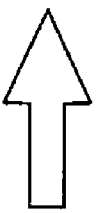
Figure 6B:
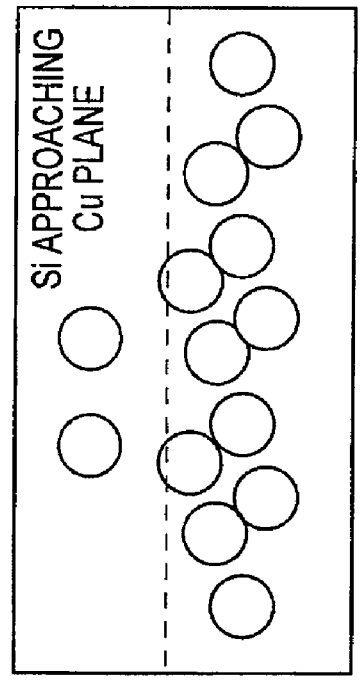

QM simulations were performed for the approach of $SiH_4$, $NH_3$, and $H_2$ molecules to a Cu metal lattice. The simulation results suggest that $SiH_4$ can be easily adsorbed on the Cu surface and H atom moieties can be removed from $SiH_4$ on Cu surface at low temperature (see FIG. 6A). For a Si atom to diffuse into Cu bulk and to form Cu—Si bonding, the heat of formation was estimated around 30~40 kcal/mol, which is equivalent to the process temperature of 300~400° C. (see FIG. 6B). This result confirms that $CuSi_xN_y$ formation is a diffusion driven process, and corresponds to our observation that Rs change was responding to soaking time only at the process temperature of 350° C.

Regarding the effect of CuO removal process to Rs, QM simulations demonstrated that Cu surface exposed to a reducing gas plasma of $d-NH_3$ is covered with —$NH_2$. During the $SiH_4$ soaking step, the $SiH_4$ forms strong bonds with the —$NH_2$ at the Cu surface hindering the diffusion of Si into the bulk Cu. In contrast, —H bonded to the Cu surface following an $H_2$ plasma treatment doesn't interact with the $SiH_4$ at the Cu surface, allowing the silicon to diffuse more deeply into the bulk Cu. This simulation result not only agrees with the experimental data, but also indicates that a change in sheet resistance (Rs) can be engineered by tuning the amount of —$NH_2$ on Cu surface.

Figure 7:
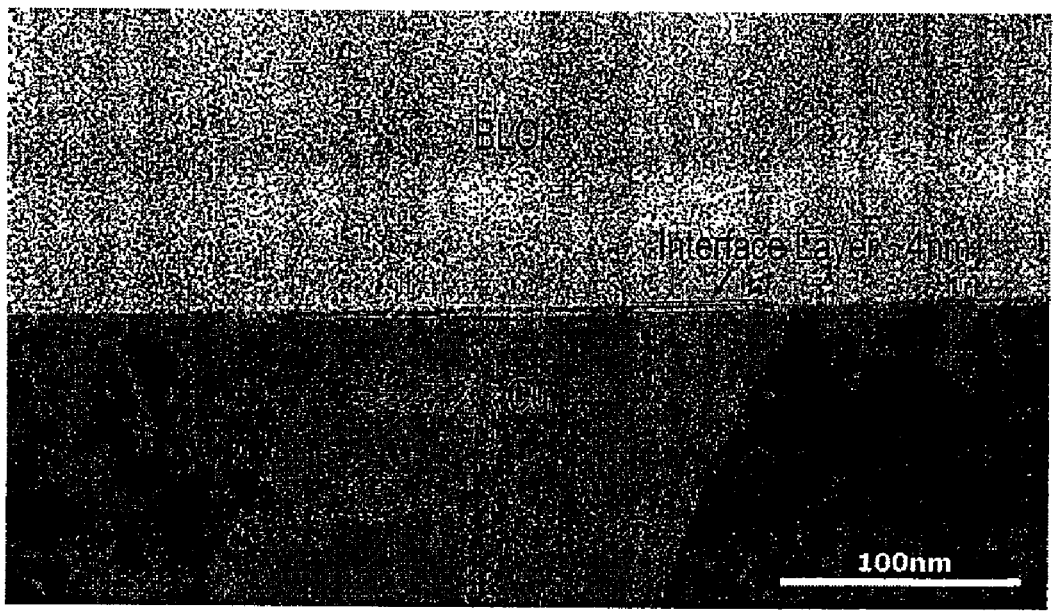
FIG. 7 is a TEM cross-section of a BLOk™ barrier layer deposited on an underlying $CuSi_xN_y$/Cu interconnect formed in a Black Diamond™ film according to embodiments of the invention.

FIG. 7 shows a TEM image of the $CuSi_xN_y$ layer on copper with BLOk film deposited on top of it. The measured thickness of the $CuSi_xN_y$ film by TEM is ~40 Å.

Figure 8A:
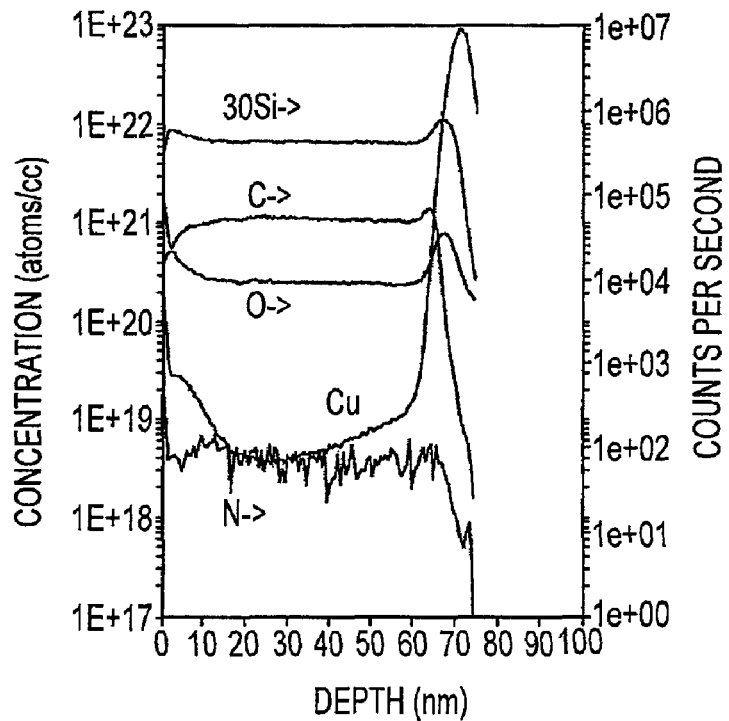
FIGS. 8A&B show SIMS depth profiles of SiOCH deposited on copper film without and with a $CuSi_xN_y$ adhesion layer at the copper interface.
Figure 8B:
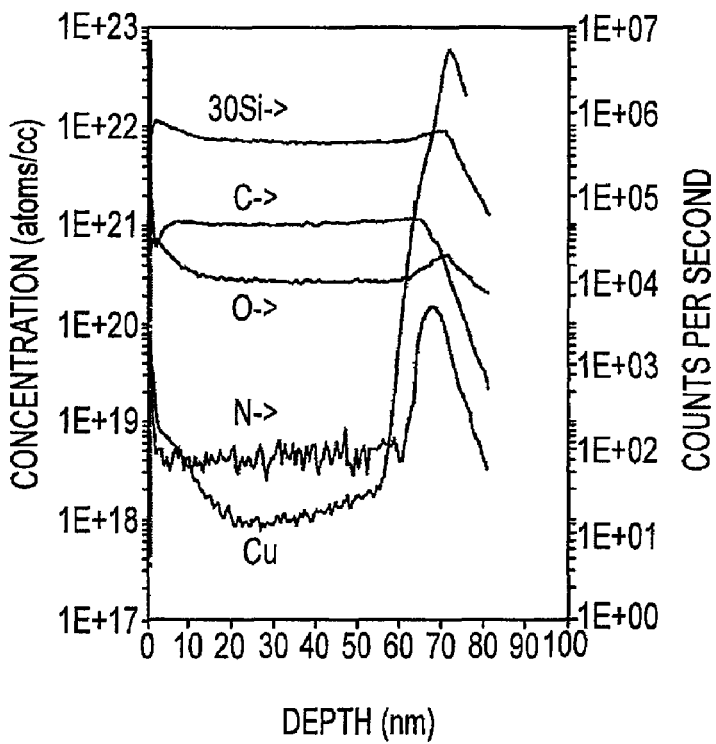

The $CuSi_xN_y$ layer can also act as a barrier to copper diffusion. FIG. 8A shows the copper diffusion profile for 1000 Å SiOCH film deposited on top of copper without any $CuSi_xN_y$, while FIG. 8B shows the profile for SiOCH deposited on top of $CuSi_xN_y$ which was formed on copper. Both samples were annealed at 400 C for 3 hours. Comparing the atomic concentration of Cu in SiOCH film, the concentration in FIG. 8B is about two orders of magnitude lower than the concentration in FIG. 8A. This indicates that $CuSi_xN_y$ enhances the barrier property of the interface. On the other hand, there is a larger concentration of N at the copper interface in FIG. 8B, implying the presence of $CuSi_xN_y$, whereas there is no N peak at the copper interface in FIG. 8A. The $CuSi_xN_y$ layer is expected to improve EM performance by improving the interface between BLOk and copper.

To summarize, the formation and characterization of a $CuSi_xN_y$ layer has been investigated to improve the interface properties between BLOk and copper. The $CuSi_xN_y$ formation process at 350° C. gives a good adhesion strength than lower process temperature, and its Rs increase is tunable, which is also supported by QM simulation. The process temperature of 350° C. also provides a benefit that all the processes—He and $NH_3$ pretreatments, $CuSi_xN_y$ formation, and BLOk deposition—may be done in-situ in the same chamber, such as a Producer platform. $CuSi_xN_y$ layer also acts as an effective copper diffusion barrier. The film thickness and composition of $CuSi_xN_y$ layer has been characterized using TEM.

The quality of the interface between copper and the dielectric copper barrier is important for device reliability. For embodiments of the invention, the interface between copper and an a copper diffusion barrier layer was investigated through the selective formation of a thin copper silicon nitride ($CuSi_xN_y$) layer. The process conditions were optimized to form $CuSi_xN_y$, such that the $CuSi_xN_y$ layer is formed without increasing the sheet resistance of the underlying copper film. The thickness of $CuSi_xN_y$ layer may be ~40 Å (as measured by Transmission Electron Microscopy (TEM)), and the diffusion barrier property of the $CuSi_xN_y$ layer was measured by Secondary Ion Mass Spectrometry (SIMS) depth profiling. To minimize the change in the dielectric constant ($\kappa$) of the surrounding carbon doped silicon oxide dielectric material during the formation of the $CuSi_xN_y$, a pretreatment process using He was developed. Finally, quantum mechanical (QM) simulation was performed to understand the fundamentals of this process. The test and simulation results demonstrated that the CuSi$_x$N$_y$ formation process at 350° C. can significantly reduce the electromigration (EM) of copper.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

What is claimed is:

1. A process to form a copper-silicon-nitride layer on a copper surface on a semiconductor wafer, the process comprising:
    exposing the wafer to a first plasma made from helium;
    exposing the wafer to a second plasma made from a diluted ammonia gas mixture, wherein the second plasma removes copper oxide from the copper surface adjacent to a carbon-doped silica dielectric material;
    exposing the wafer to silane, wherein the silane reacts with the copper surface to selectively form copper silicide; and
    exposing the wafer to a third plasma made from ammonia and molecular nitrogen to form the copper silicon nitride layer.

2. The process of claim 1, wherein a barrier layer is formed on the copper silicon nitride layer.

3. The process of claim 2, wherein the barrier layer comprises a silicon carbide film.

4. The process of claim 1, wherein the copper silicon nitride layer has a thickness of about 10 Å to about 100 Å, and a sheet resistance of about $1\times10^{-8}$ Ωm to about $1\times10^{-7}$ Ωm.

5. The process of claim 1, wherein the process further comprising annealing the wafer after the exposure to the third plasma.

6. The process of claim 5, wherein the wafer is annealed for a time of about 1 minute to about 60 minutes at a temperature of about 300° C. to about 500° C.

7. The process of claim 1, wherein the first plasma consists essentially of helium.

8. The process of claim 1 wherein the diluted ammonia gas mixture is diluted with helium.

9. A process of forming a dielectric barrier for a copper interconnect, the process comprising:
    forming a gap in a carbon-doped silica dielectric material and forming at least part of the copper interconnect in the gap;
    exposing a surface of the copper interconnect to a first plasma made from helium;
    exposing the copper surface to a second plasma made from a diluted ammonia gas mixture, wherein the second plasma removes copper oxide from the copper surface;
    exposing the copper surface to silane, wherein the silane reacts with the copper surface to selectively form copper silicide;
    exposing the copper silicide to a third plasma made from ammonia and molecular nitrogen to form the copper silicon nitride layer; and
    depositing the barrier layer on the copper silicon nitride layer.

10. The process of claim 9, wherein the baffler layer comprises a silicon carbide layer.

11. The process of claim 9, wherein the process further comprises annealing the copper silicon nitride layer.

12. The process of claim 9, wherein the first plasma consists essentially of helium.

13. A process of forming a selective copper silicon nitride layer on a copper surface in contact with a carbon-doped silica dielectric material on a wafer substrate, the process comprising:
    pretreating the copper surface with a first plasma made from helium;
    additionally pretreating the copper surface with a second plasma made from a diluted ammonia gas mixture; and
    forming the copper silicon nitride layer on the pretreated copper surface, wherein a dielectric constant of the carbon-doped silica is a same or lower value than before the pretreatment with the first and second plasma.

14. The process of claim 13, wherein the first plasma consists essentially of helium.

15. The process of claim 13, wherein forming the copper silicon nitride layer comprises:
    exposing the copper surface to silane, wherein the silane reacts with the copper surface to selectively form copper silicide; and
    exposing the copper silicide to a third plasma made from ammonia and molecular nitrogen to form the copper silicon nitride layer.

16. The method of claim 13, wherein a barrier layer comprising silicon carbide is formed on the copper silicon nitride layer.

* * * * *